(12) United States Patent
Chien et al.

(10) Patent No.: US 12,507,490 B2
(45) Date of Patent: Dec. 23, 2025

(54) SEMICONDUCTOR DEVICE INCLUDING GERMANIUM REGION DISPOSED IN SEMICONDUCTOR SUBSTRATE

(71) Applicant: Taiwan Semiconductor Manufacturing Company, Ltd., Hsinchu (TW)

(72) Inventors: Hung-Chang Chien, Hsinchu County (TW); Jung-I Lin, Hsinchu (TW); Ming-Chieh Hsu, Hsinchu (TW); Kuan-Chieh Huang, Hsinchu (TW); Tzu-Jui Wang, Fengshan (TW); Shih-Min Huang, Hsinchu County (TW); Chen-Jong Wang, Hsin-Chu (TW); Dun-Nian Yaung, Taipei (TW); Yi-Shin Chu, Hsinchu (TW); Hsiang-Lin Chen, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 659 days.

(21) Appl. No.: 17/749,354

(22) Filed: May 20, 2022

(65) Prior Publication Data

US 2023/0207719 A1 Jun. 29, 2023

Related U.S. Application Data

(60) Provisional application No. 63/300,341, filed on Jan. 18, 2022, provisional application No. 63/294,546, filed on Dec. 29, 2021.

(51) Int. Cl.
*H10F 30/225* (2025.01)
*H10F 71/00* (2025.01)
*H10F 77/00* (2025.01)

(52) U.S. Cl.
CPC ....... *H10F 30/225* (2025.01); *H10F 71/1212* (2025.01); *H10F 77/959* (2025.01)

(58) Field of Classification Search
None
See application file for complete search history.

(56) References Cited

U.S. PATENT DOCUMENTS 6,136,628 A 10/2000 Sugiyama
10,103,285 B1* 10/2018 Lo .................... H10F 30/225
(Continued)

OTHER PUBLICATIONS

Dismukes et al. "Lattice Parameter and Density in Germanium-Silicon Alloys." The Journal of Physical Chemistry, vol. 08, No. 10. Published Oct. 1964.
(Continued)

*Primary Examiner* — Benjamin P Sandvik
(74) *Attorney, Agent, or Firm* — Eschweiler & Potashnik, LLC

(57) ABSTRACT

In some embodiments, the present disclosure relates to a single-photon avalanche detector (SPAD) device including a silicon substrate including a recess in an upper surface of the silicon substrate. A p-type region is arranged in the silicon substrate below a lower surface of the recess. An n-type avalanche region is arranged in the silicon substrate below the p-type region and meets the p-type region at a p-n junction. A germanium region is disposed within the recess over the p-n junction.

20 Claims, 18 Drawing Sheets

(56) References Cited

U.S. PATENT DOCUMENTS

| | | | |
|---|---|---|---|
| 2012/0326259 A1* | 12/2012 | Huang | H10F 30/2255 |
| | | | 257/438 |
| 2015/0097256 A1* | 4/2015 | Ang | H10F 30/2255 |
| | | | 438/69 |
| 2018/0138350 A1 | 5/2018 | Nada et al. | |
| 2018/0219120 A1* | 8/2018 | Huang | H10F 30/2255 |
| 2020/0105812 A1* | 4/2020 | Sze | H10F 39/1843 |
| 2021/0058042 A1 | 2/2021 | Na et al. | |
| 2021/0066529 A1 | 3/2021 | Lu et al. | |
| 2021/0091239 A1 | 3/2021 | Chern | |
| 2021/0320217 A1 | 10/2021 | Levy et al. | |
| 2021/0375959 A1 | 12/2021 | Hung et al. | |
| 2022/0050184 A1 | 2/2022 | Paul et al. | |
| 2022/0140156 A1 | 5/2022 | Yagi et al. | |
| 2023/0132945 A1 | 5/2023 | Otake et al. | |

OTHER PUBLICATIONS

Vines et al. "High performance planar germanium-on-silicon single-photon avalanche diode detectors" Nature Communications, 10:1086, published in 2019.

* cited by examiner

SEMICONDUCTOR DEVICE INCLUDING GERMANIUM REGION DISPOSED IN SEMICONDUCTOR SUBSTRATE

RELATED APPLICATIONS

This application claims the benefit of U.S. Provisional Application No. 63/294,546, filed on Dec. 29, 2021, the contents of which are hereby incorporated by reference in their entirety. This Application also claims the benefit of U.S. Provisional Application No. 63/300,341, filed on Jan. 18, 2022, the contents of which are hereby incorporated by reference in their entirety.

BRIEF DESCRIPTION OF THE DRAWINGS

A single-photon avalanche diode (SPAD) is a solid-state photodetector in the same family as photodiodes and avalanche photodiodes (APDs). As with photodiodes and APDs, a SPAD is based around a semiconductor p-n junction that can be illuminated with ionizing radiation such as gamma, x-rays, beta, and/or alpha particles along with a wide portion of the electromagnetic spectrum from ultraviolet (UV) through the visible wavelengths and into the infrared (IR). During operation, a photo-generated carrier is accelerated by an electric field in the device to a kinetic energy which is enough to overcome the ionization energy of the bulk material, knocking electrons out of an atom of the bulk material. A large avalanche of current carriers grows exponentially and can be triggered from as few as a single photon-initiated carrier. A SPAD is able to detect single photons providing short duration trigger pulses that can be counted. However, they can also be used to obtain the time of arrival of the incident photon due to the high speed that the avalanche builds up.

BACKGROUND

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1:
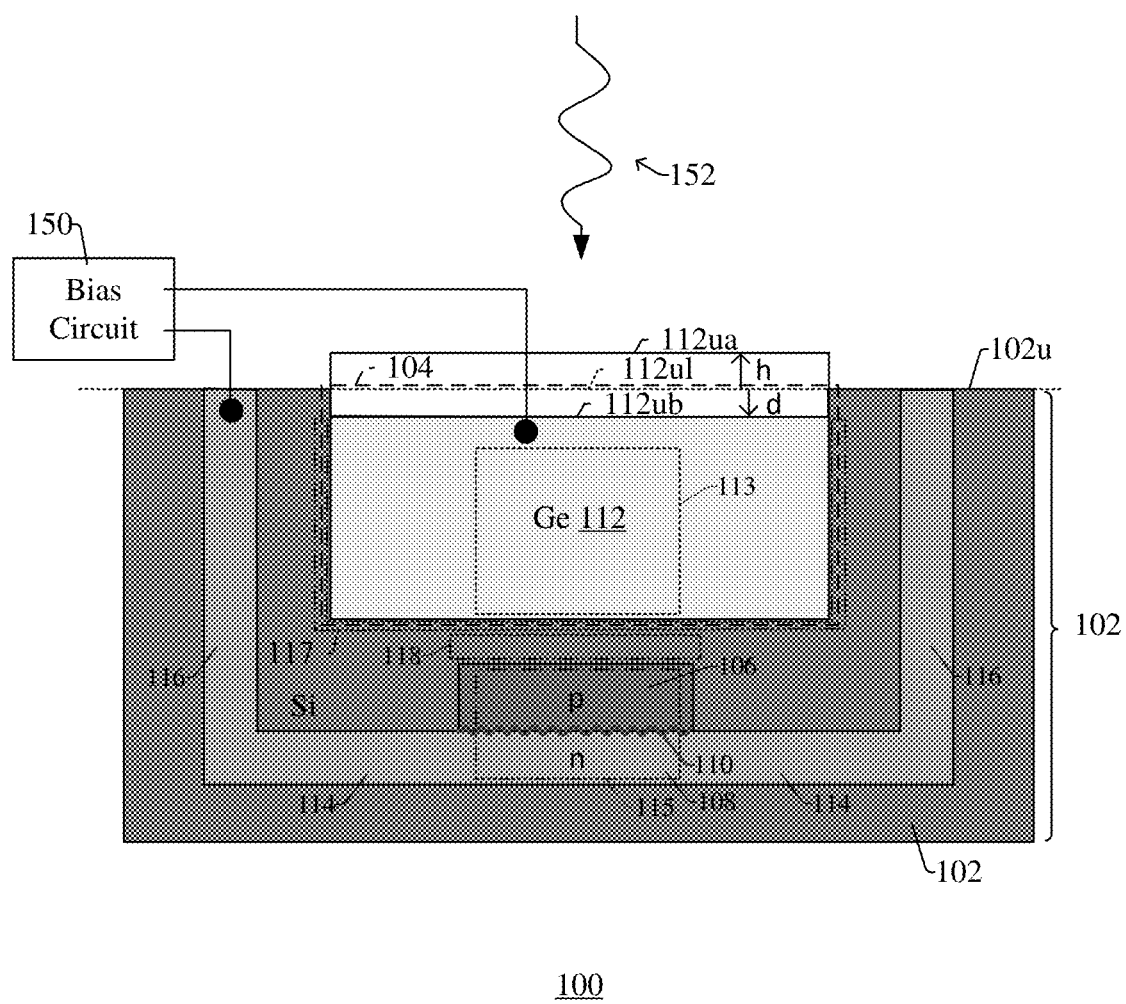

FIG. 1 illustrates a cross-sectional view of some embodiments of an integrated chip having a SPAD device including a germanium region embedded in a silicon substrate.

Figure 2:
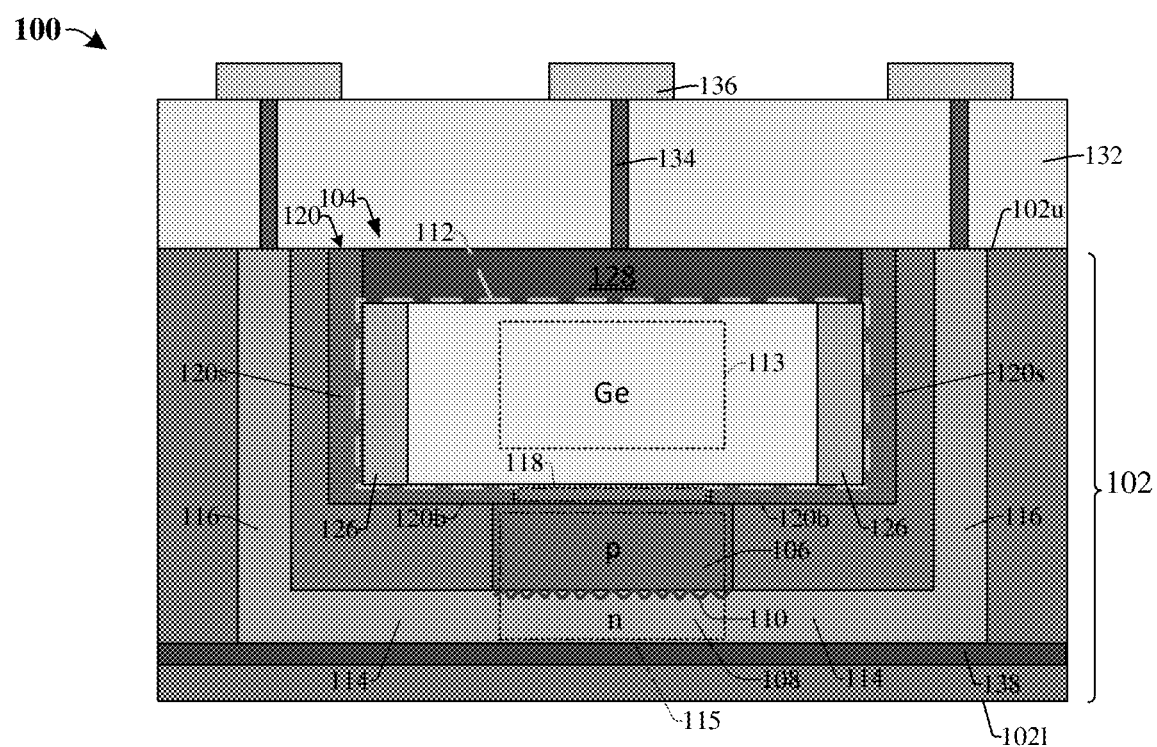

FIG. 2 illustrates a cross-sectional view of some embodiments of an integrated chip having a SPAD device including a germanium region embedded in a silicon substrate.

Figure 3A:
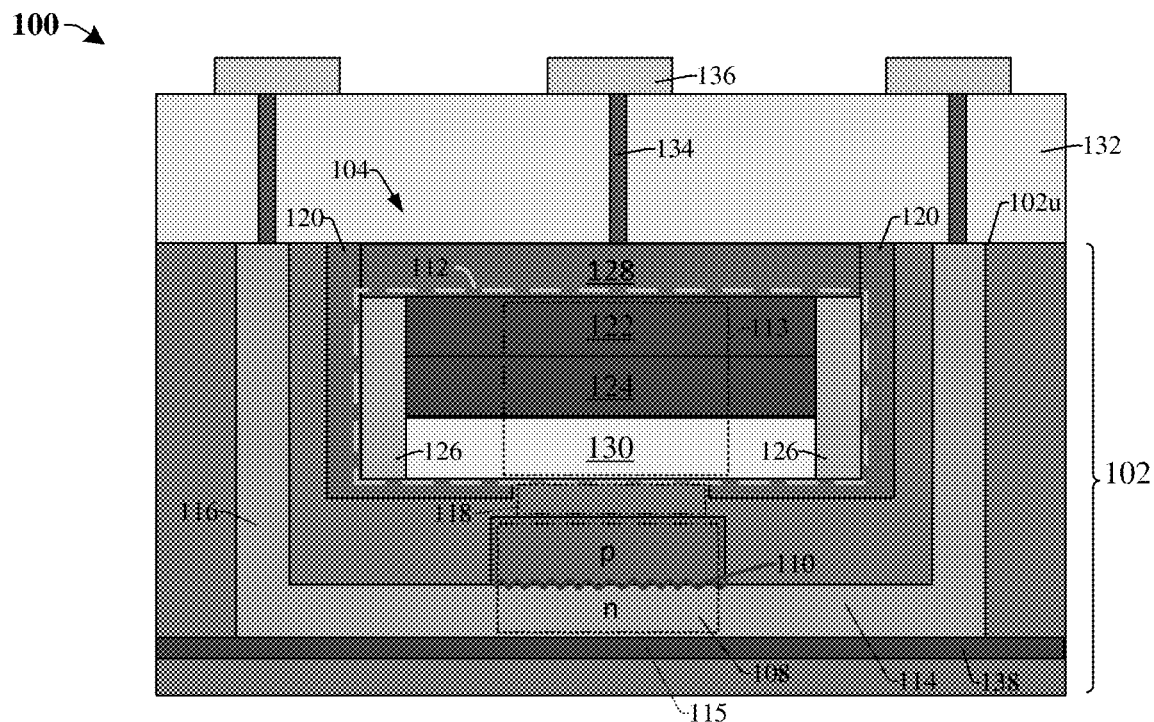

FIG. 3A illustrates a cross-sectional view of some embodiments of an integrated chip having a SPAD device including a germanium region embedded in a silicon substrate.

Figure 3B:
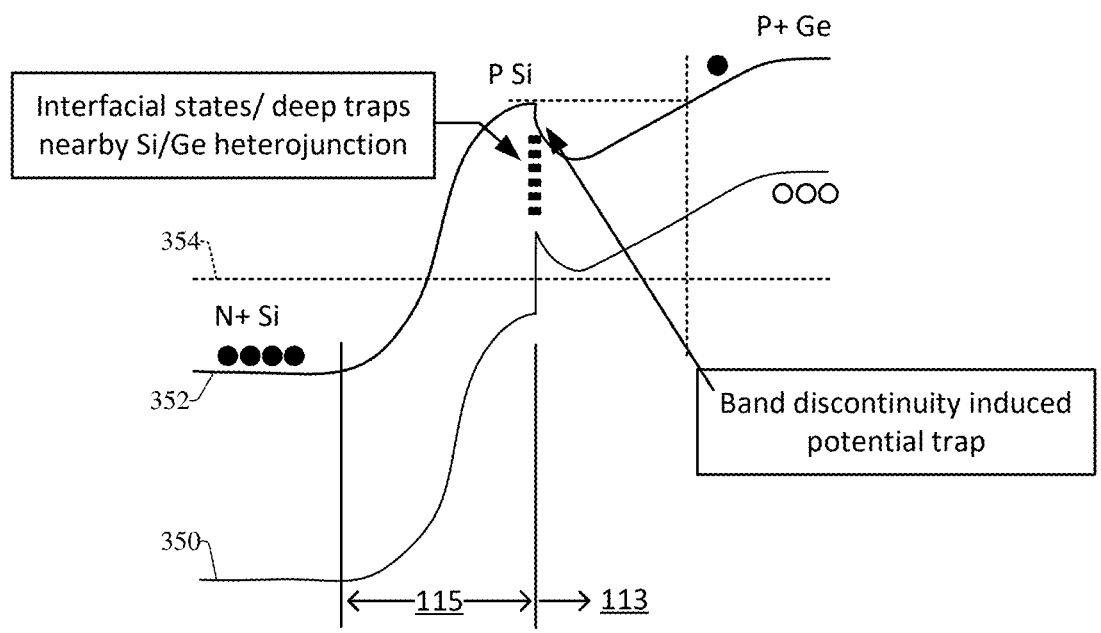

FIG. 3B illustrates a bandgap diagram of some embodiments of a SPAD device consistent with FIG. 3A.

Figure 4:
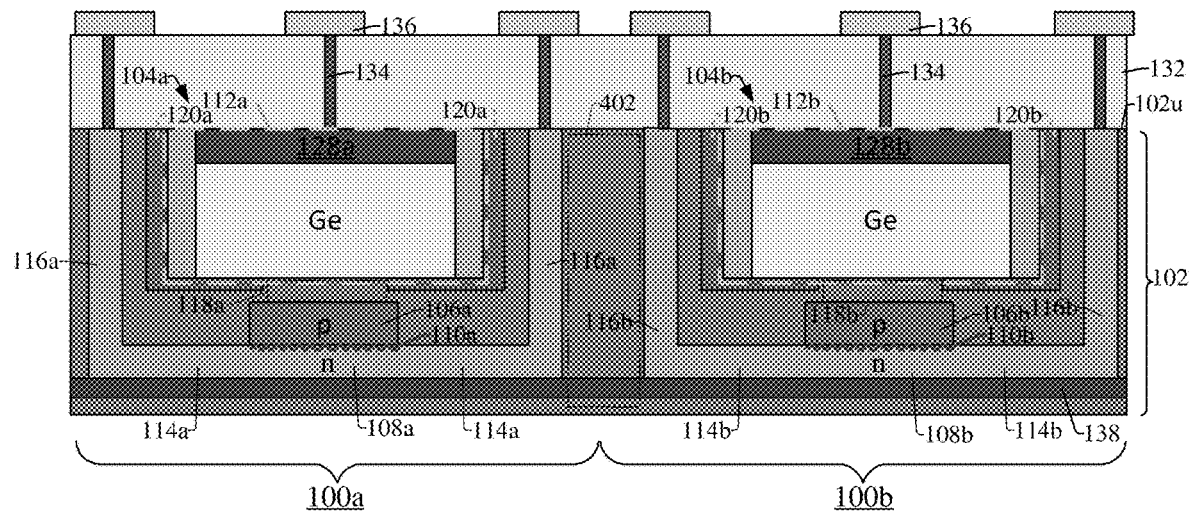
Figure 5:
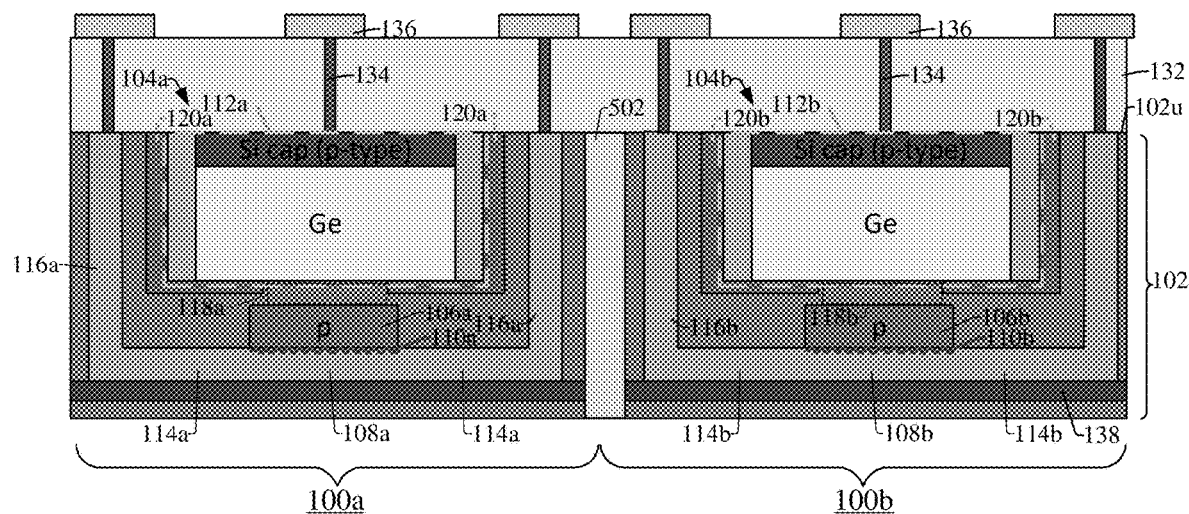

FIGS. 4-5 illustrate cross-sectional views of some embodiments of an integrated chip having multiple SPAD devices each of which includes a germanium region embedded in a silicon substrate.

FIGS. 6-14 show a manufacturing flow in accordance with some embodiments.

FIGS. 15-21 show another manufacturing flow in accordance with other embodiments.

FIGS. 22-29 show another manufacturing flow in accordance with other embodiments.

Figure 30:
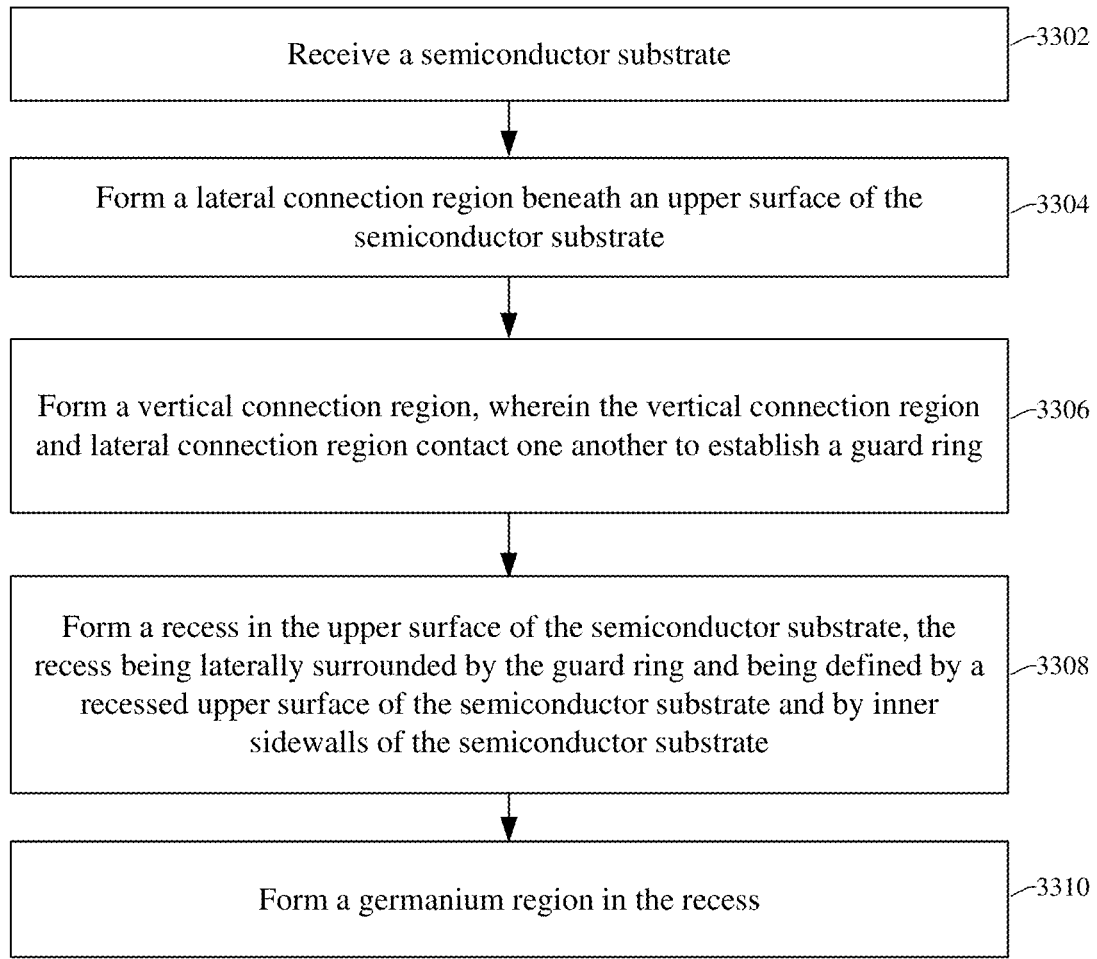

FIG. 30 illustrates a flow chart of a manufacturing flow in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a single-photon avalanche detector (SPAD) device 100 in accordance with some embodiments. The SPAD device 100 includes a silicon substrate 102 including a recess 104 in an upper surface 102$u$ of the silicon substrate 102. A p-type region 106 is arranged in the silicon substrate below a lower extent of the recess 104. An n-type avalanche region 108 is arranged in the silicon substrate 102 below the p-type region 106, and meets the p-type region 106 at a p-n junction 110 corresponding to a photodiode in the silicon substrate 102. A germanium region 112 is disposed within the recess 104. An upper surface of the germanium region 112 may reside at a depth (d) below the upper surface 102$u$ of the silicon substrate 102 (see 112$ub$), may be level with the upper surface 102$u$ of the substrate (see 112$ul$), or may reside at a height (h) above the upper surface 102$u$ of the substrate (see 112$uu$). In some embodiments, an intrinsic silicon region 118 can be disposed between an upper extent of the p-type region 106 and a bottom surface of the germanium region 112. The intrinsic silicon region 118 is configured to act as an electron channel between the p-n junction 110 and the germanium region 112. A bias circuit 150 is configured to apply a bias to the p-n junction 110 to apply a voltage larger than an avalanche breakdown voltage to the SPAD device 100, and is also configured to quench the SPAD device 100 after an avalanche has occurred. The bias circuit 150 may be implemented by using transistors and/or other active device or passive devices disposed on or in the silicon substrate 102 or disposed in another substrate.

In some cases, the germanium region 112 meets the silicon substrate 102 at a Ge—Si interface region 117. The Ge—Si interface region 117 is defined where outer sidewalls and a lower surface of the germanium region 112 meet inner sidewalls and a recessed upper surface, respectively, of the silicon substrate 102. This Ge—Si interface region 117 is comprised of a Ge—Si alloy having a lattice constant ranging between 56.6 nanometers (nm) 54.3 nm. In some cases, the Ge—Si alloy can have a thickness ranging from 1 angstrom to 20 nm, and can have a cross-section that is U-shaped.

An n-type lateral connection region 114 extends laterally from outer edges of the p-n junction 110 and past outer sidewalls of the germanium region 112. An n-type vertical connection region 116 extends upwardly from outer edges of the n-type lateral connection region 114 to the upper surface 102u of the silicon substrate 102. In some contexts, the n-type lateral connection region 114 and/or the n-type vertical connection region 116 may be referred to as a "guard ring" because the n-type vertical connection region 116 laterally surrounds the germanium region 112 when viewed from above. In some embodiments, the n-type avalanche region 108, the n-type lateral connection region 114, and the n-type vertical connection region 1106 collectively establish a U-shaped cross-sectional profile that generally enclose the p-type region 106 and the germanium region 112 when viewed in cross-section.

During operation, the bias circuit 150 biases the p-n junction 110 above an avalanche breakdown voltage. Under this bias condition, when an incident photon 152 (e.g., from a laser pulse) is absorbed in an absorption region 113 corresponding to the germanium region 112, an electron-hole pair is created and the electron drifts through the intrinsic silicon region 118 and into a multiplication region 115, which includes the p-n junction 110. The electron is then accelerated in the multiplication region 115, gaining sufficient kinetic energy to undergo impact ionization, creating a secondary electron-hole pair. The second electrons and holes of the second electron-hole pair are in turn accelerated and impact ionized, creating further electron-hole pairs in the multiplication region 115. Further impact ionization of holes and electrons rapidly creates a large avalanche current which can be self-sustaining if the device is biased above avalanche breakdown. Under these conditions, this results in a detectable electronic signal that can be timed relative to the initial incident photon 152 (e.g., from onset of the laser pulse). After detection, bias circuit 150 momentarily biases the SPAD device 100 below the avalanche breakdown voltage to quench the avalanche, after which the SPAD device 100 can return to its quiescent state ready to detect further incident photons.

Notably, due to the presence of the germanium region 112 being disposed in the recess 104 within the upper surface 102u of the silicon substrate 102, dark current rate (DCR) can be reduced in some regards compared to other approaches. Further, the germanium region 112 also allows good absorption (detection) of short-wave infrared (SWIR) signals, which does not occur with purely silicon-based SPADs. Thus, the SPAD device 100 is a germanium (Ge) in silicon (Si) Separate Absorption and Multiplication (SAM) device. In this device, forming the germanium region 112 in the recess 104 in the silicon substrate 102 rather than simply as a plateau on an upper surface of the substrate offers several advantages.

FIG. 2 illustrates another embodiments of a SPAD device 100 in accordance with some embodiments. The SPAD device 100 again includes a silicon substrate 102 including a recess 104 in an upper surface 102u of the silicon substrate. A p-type region 106 is arranged in the silicon substrate below a lower extent of the recess 104. An n-type avalanche region 108 is arranged below the p-type region 106 and meets the p-type region 106 at a p-n junction 110. A germanium region 112 is arranged in the recess 104.

An n-type lateral connection region 114 extends laterally from outer edges of the p-n junction 110 and past outer sidewalls of the germanium region 112. An n-type vertical connection region 116 extends upwardly from outer edges of the n-type lateral connection region 114 to the upper surface 102u of the silicon substrate 102. In some contexts, the n-type lateral connection region 114 and/or the n-type vertical connection region 116 may be referred to as a "guard ring" because the n-type vertical connection region 116 laterally surrounds the germanium region 112 when viewed from above. In some embodiments, the n-type avalanche region 108, the n-type lateral connection region 114, and the n-type vertical connection region 1106 collectively establish a U-shaped cross-sectional profile that generally enclose the p-type region 106 and the germanium region 112 when viewed in cross-section.

In some embodiments, the SPAD device further includes a p-type surface region 120 that lines the recess 104 and laterally surrounds the intrinsic silicon region 118. The p-type surface region comprises is made of silicon, such as monocrystalline silicon. The p-type surface region 120 includes a base portion 120b having a central opening corresponding to the intrinsic silicon region 118, and includes a sidewall portion 120s extending upwards along outer sidewalls of the germanium region 112 (and/or along inner sidewalls of the recess 104 in the silicon substrate).

In some embodiments, the germanium region 112 further includes a bulk region corresponding to the absorption region 113, wherein the bulk region and absorption region 113 are intrinsic (un-doped) germanium. A sidewall germanium region 126 extends continuously along an outer sidewall of the germanium region 112. The sidewall germanium region 126 is also p-type. The p-type surface region 120 and the sidewall germanium region help to reduce leakage, and thus may mitigate dark current that arises due to stress, dislocations, and the like arising at the Ge—Si interface region.

A cap 128, such as a p-type silicon cap, is disposed over an upper surface of the germanium region 112 to limit/prevent oxidation of a top surface of the germanium region 112. In the illustrated example the cap 128 has an upper surface that is flush or level with the upper surface 102u of the silicon substrate, but in other cases, the upper surface of the cap 128 could be recessed below the upper surface of the silicon substrate or could be raised above the upper surface of the silicon substrate. Further, in the illustrated embodiment, the cap 128 has a lower surface that directly contacts and is flush or level with upper surfaces of the bulk germanium region and the sidewall germanium region 126. In other embodiments, however, the sidewall germanium region 126 is arranged in an outer edge of the recess 104 and extends upwardly along an outer sidewall of the cap 128 to be level with the upper surface 102u of the silicon substrate 102.

A dielectric structure 132, such as can be made of silicon dioxide or a low-k dielectric material, extends over the upper surface 102u of the substrate. Conductive contacts 134, such as metal contacts, extend through the dielectric structure 132, and metal lines or conductive pads 136 are formed over the conductive contacts. The metal lines or conductive pads 136 can be operably coupled to a bias circuit (e.g., bias circuit 150 of FIG. 1), which may include semiconductor devices formed on the silicon substrate 102 or formed on another semiconductor substrate. For example, if the semiconductor devices are formed on the silicon substrate 102, the semiconductor devices may include transistors including fins and/or a gate electrode disposed on the upper surface 102u of the substrate, or alternatively may include transistors including fins and/or a gate electrode disposed on the lower surface 102l of the substrate in which case a through silicon via may extend through the substrate to facilitate the operable coupling.

Referring now to FIG. 3A, in some embodiments, the germanium region 112 includes an upper germanium region 122 with a first p-type doping concentration, and an intermediate germanium region 124 with a second p-type doping concentration, and a bottom germanium region 130 having a third p-type doping concentration or being intrinsic (undoped) germanium. The second p-type doping concentration is less than the first p-type doping concentration, and the third doping concentration, if present at non-zero dopant levels, is less than the second doping concentration. In some cases, the first, second, and/or third doping concentrations are substantially flat/constant over their respective depths in the upper germanium region 122, intermediate germanium region 124, and bottom germanium region 130; while in other cases these doping concentrations exhibit distinct "kinks" or discontinuities at the illustrated upper and lower edges of the respective regions illustrated in FIG. 3A. In other cases, the variations in doping concentration are more gradual and/or continuous over the entire depth of the germanium region 112. In some embodiments, the sidewall germanium regions 126 extend continuously along an outer sidewall of the germanium region 112 and traverse the upper germanium region 122, intermediate germanium region 124, and lower germanium region 130. Use of such doping regions as illustrated in FIG. 3A may help facilitate a lensing function for the SPAD device to improve jitter performance, wherein carriers drift more efficiently to the p-n junction 110.

FIG. 3B illustrates an example band diagram consistent with some embodiments of the SPAD device of FIG. 3A. The band diagram includes a conduction band 350 and a valance band 352, where the left hand portion of the band diagram corresponds to n-type material (e.g., n avalanche region 108) and the right hand portion of the band diagram corresponds to p-type material (e.g., p+ germanium). The fermi level of the device is represented by line 354. As shown, at the interface between the absorption region 113 and multiplication region 115, interfacial states and/or deep traps are located near the silicon/germanium heterojunction, and these traps induce a discontinuity in the valance band and conduction band. In particular, the valance band includes an S-shaped curve in multiple region 115, then exhibits a steep (e.g., vertical) rise at the interface between the absorption region 113 and multiplication region 115, then has a "dip" within the absorption region before coming back up to the maximum valance band energy. The conduction band also includes an S-shaped curve in multiple region 115, but here the top of the S-shaped curve corresponds to a peak or crest, followed by a "dip" within the absorption region before coming back up to the maximum conduction band energy.

FIGS. 4-5 show some embodiments where first and second SPAD are arranged side-by-side in a silicon substrate. In FIGS. 4-5, a first SPAD device 100a and a second SPAD device 100b each have features as previously described in FIG. 2, wherein features marked with a and b have the same or similar structure and function as described with regards to FIG. 2 (e.g., 102a and 102b in FIGS. 4-5 correspond to 102 in FIG. 2; 106a, 106b in FIGS. 4-5 correspond to 106 in FIG. 2; and so on). Thus, in FIGS. 4-5, a first n-type vertical connection region 116a laterally surrounds the germanium region 112a of the first SPAD device 100a, and a second n-type vertical connection region 116b laterally surrounds the germanium region 112b of the second SPAD device 110b. A portion of the silicon substrate 402 separates the first n-type vertical connection region 116a from the second n-type vertical connection region 116b. In the embodiment of FIG. 4, this portion of the silicon substrate can be intrinsic monocrystalline silicon. In FIG. 5, an isolation structure 502, such as a 402 deep trench isolation structure made of dielectric material or including p-type silicon, separates the first n-type vertical connection region 116a from the second n-type vertical connection region 116b. It will be appreciated that any number of SPAD devices can be arranged in a silicon substrate, and they can be arranged in an array that includes a number of rows and columns for example. Also, although FIGS. 4-5 have been illustrated in an example where the first SPAD device 102a and second SPAD device 102b correspond to the SPAD device of FIG. 2, in other embodiments the first SPAD device 102a and second SPAD device 102b could correspond to the SPAD device of FIG. 1 or FIG. 3A, and/or other illustrated embodiments and/or combinations thereof.

FIGS. 6-14 show a manufacturing flow in accordance with some embodiments. Although FIGS. 6-14 are described in relation to a method, it will be appreciated that the structures disclosed in FIGS. 6-14 are not limited to such a method, but instead may stand alone as structures independent of the method.

Figure 6:
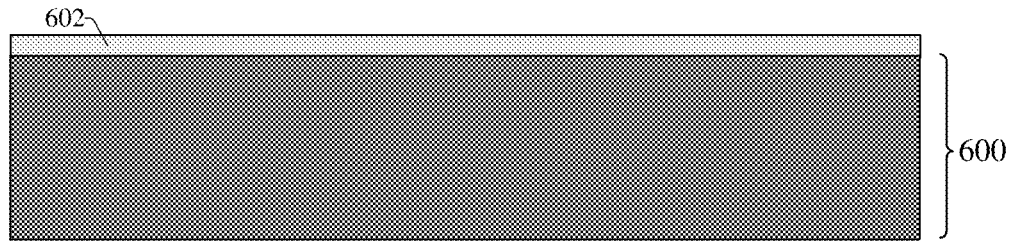

In FIG. 6, a base semiconductor substrate 600 is received, and a sacrificial oxide 602 is formed on an upper surface of the semiconductor substrate. In some embodiments, the semiconductor substrate 600 is a monocrystalline silicon wafer, but in other embodiments the semiconductor substrate can take other forms. For instance, the semiconductor substrate 600 can be a silicon on insulator substrate, a sapphire substrate, or a III-V substrate, among others. The sacrificial oxide 602 can be silicon dioxide or another silicon oxide, such as silicon oxy-nitride, among others. The sacrificial oxide 602 can be formed by thermal oxidation, rapid thermal anneal, plasma vapor deposition, chemical vapor deposition, spin on, or other techniques. In some embodiments, the sacrificial oxide 602 has a thickness ranging between 30 angstroms and 300 angstroms, or between 75 angstroms and 120 angstroms, or is about 90 angstroms.

Figure 7:
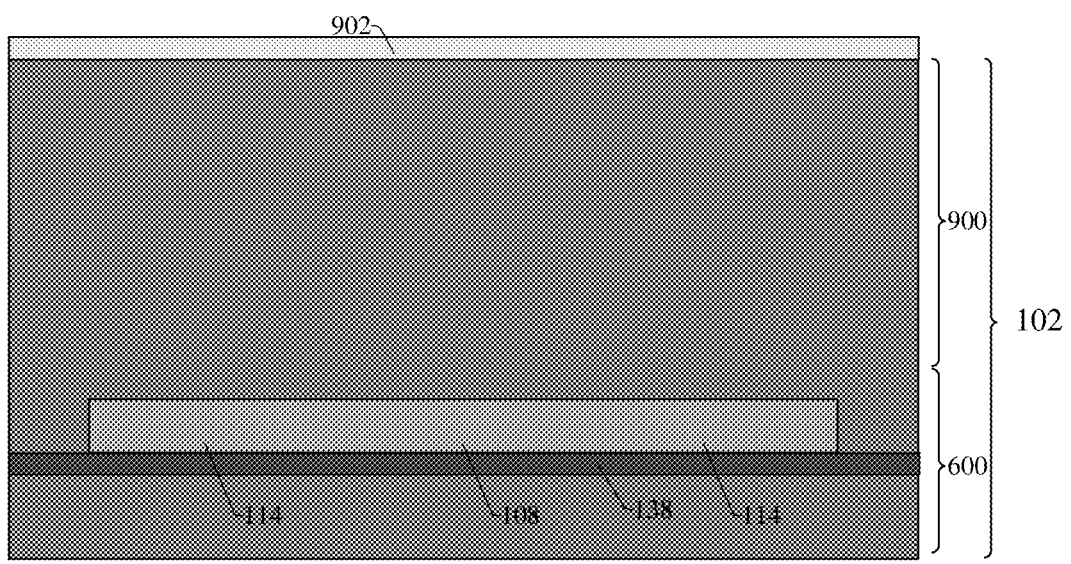

In FIG. 7, a blanket p-type implant, such as a boron, aluminum, or indium implant, is performed to form a buried p-type region 138 in the semiconductor substrate. An n-type implant, such as a phosphorus, arsenic, or antimony implant, is then carried out with a first photoresist mask in place to form an n-type avalanche region 108 and an n-type lateral connection region 114.

Figure 8:
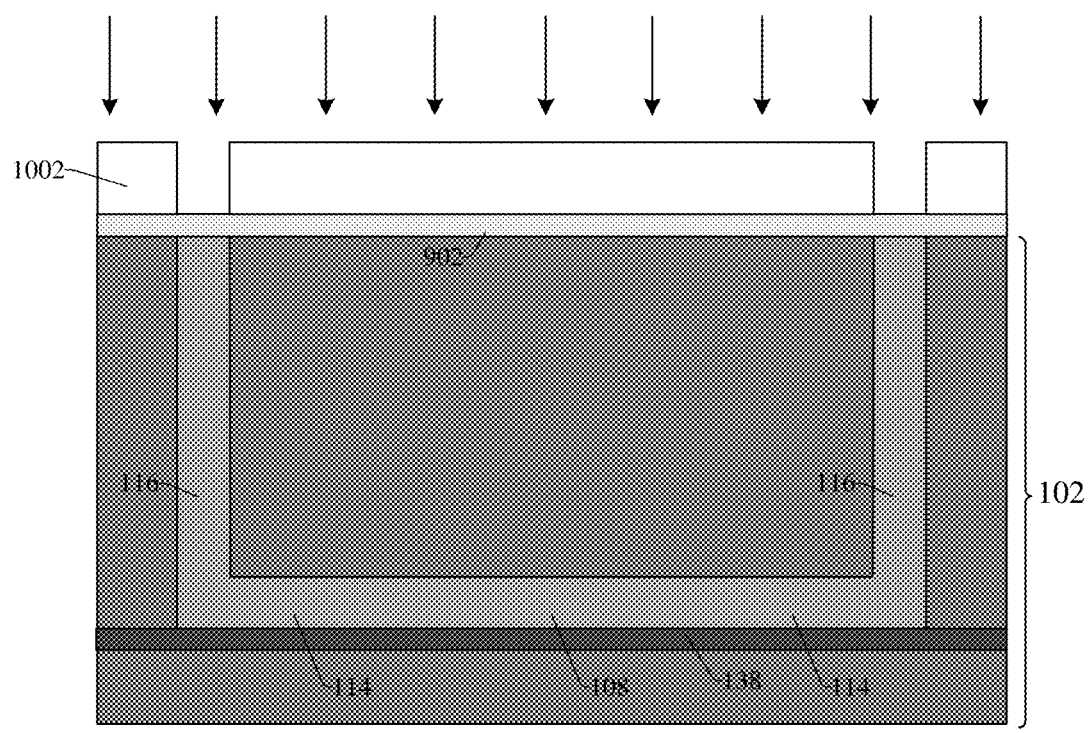

In FIG. 8, the sacrificial oxide is removed and an epitaxial monocrystalline silicon region 900 is epitaxially formed over an upper surface of the base semiconductor substrate 600, thereby providing a monocrystalline silicon substrate in some cases. In some embodiments, removal of the sacrificial oxide and epitaxial formation of the epitaxial monocrystalline silicon region 900 are performed in situ. In situ processing can help ensure a lack of oxide on the base semiconductor substrate, thereby helping to promote high quality crystalline growth with few or no defects. Another sacrificial oxide layer 902 is then formed over the epitaxial monocrystalline silicon region 900. In some cases, the sacrificial oxide layer 902 is formed by an in-situ steam generation (ISSG) process, but can also be formed via thermal oxidation, physical vapor deposition (PVD), chemical vapor deposition (CVD), among others. In some embodiments, the sacrificial oxide 902 has a thickness ranging between 30 angstroms and 300 angstroms, or between 75 angstroms and 120 angstroms, or is about 90 angstroms.

In FIG. 8, a second photoresist mask 1002 is then formed over the sacrificial oxide layer 902, and an n-type implant, such as a phosphorus, arsenic, or antimony implant, is then carried out with the second photoresist mask in place to form an n-type vertical connection region 116. Although FIG. 8 illustrates the outer edges of the n-type vertical connection region 116 being aligned with outer edges of the n-type lateral connection region 114, in other embodiments there can be some offset between these outer edges such that the edges of the n-type lateral connection region 114 can be shifted left or right relative to outer edges of the n-type vertical connection region 116.

Figure 9:
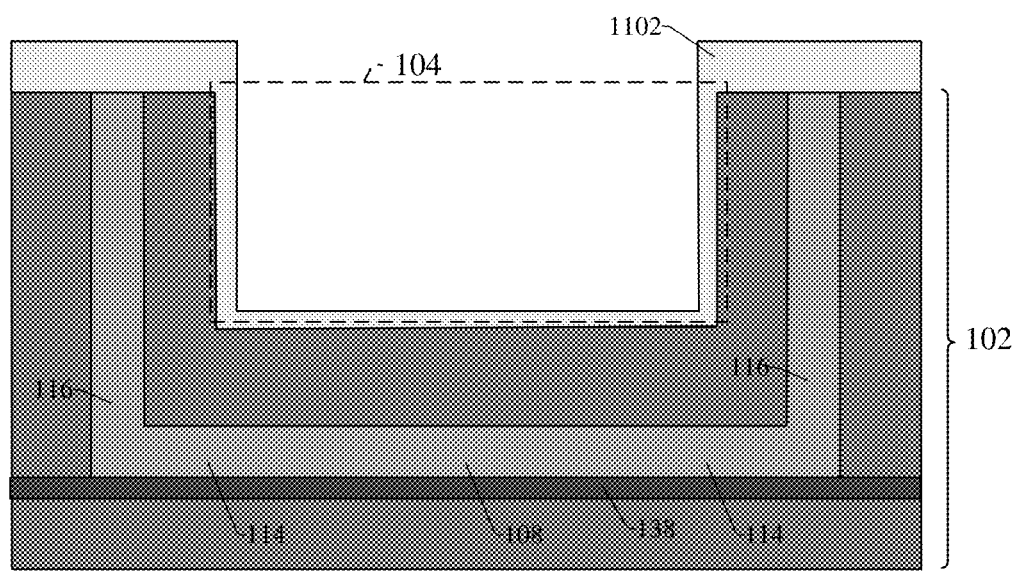

In FIG. 9, an un-doped silicate glass (USG) region is formed, for example with a thickness ranging between 200 angstroms and 1200 angstroms. A third photoresist mask (not shown) is then formed, and an etch is carried out with the third photomask in place to form a recess 104 in an upper surface of the silicon substrate 102. In some cases, the recess 104 may have a depth, d, of approximately 1 micrometer. Another oxide layer 1102 can be formed, for example with a thickness ranging from 500 angstroms to 1000 angstroms for example by in-situ steam generation (ISSG), to line a lower surface and sidewalls of the recess 104, and to extend over the upper surface of the semiconductor substrate.

Figure 10:
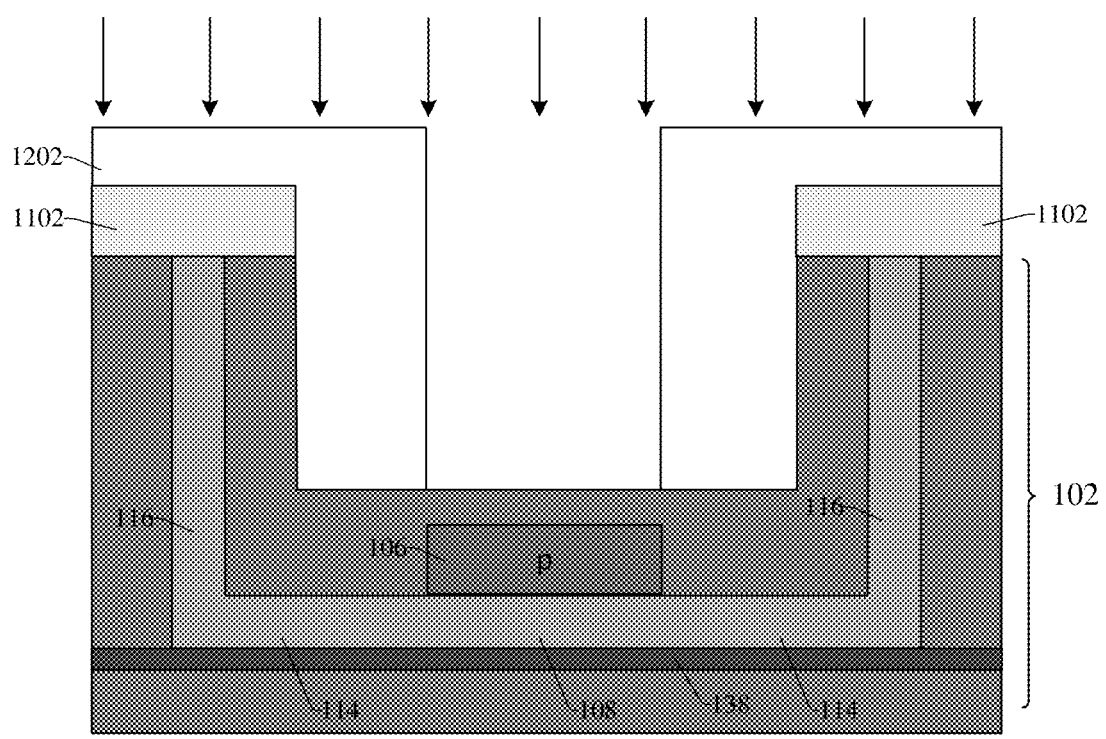

In FIG. 10, a fourth photomask 1202 is formed, and a p-type region 106 is formed. The p-type region 106 can formed at a depth d below the recessed surface and spaced below the recessed surface, thereby leaving an intrinsic silicon region between the p-type region and the recessed surface.

Figure 11:
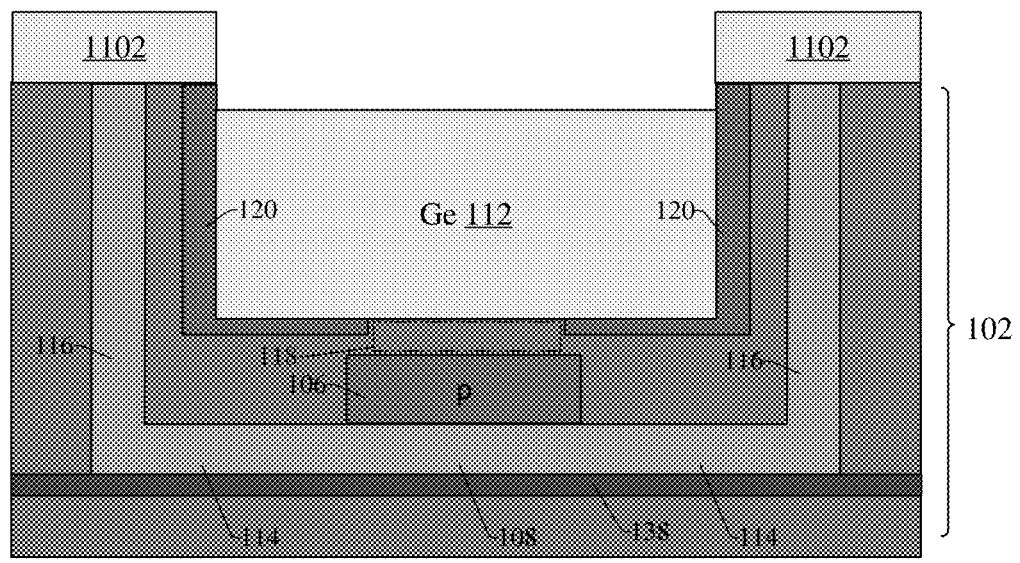

In FIG. 11, a p-type surface region 120 has been formed in the semiconductor substrate, wherein this formation leaves an intrinsic silicon region 118 over the p-type region 106. Further, a germanium region 112 is formed, for example by epitaxial growth. The germanium region 112 can be formed to have an upper surface that recessed below an upper surface of the silicon substrate 102. However, in other embodiments, the germanium region 112 can be formed to have an upper surface that level with or even raised above an upper surface of the silicon substrate 102. In some cases, the germanium region 112 forms a thin alloy with the silicon substrate as the germanium region is grown, such that the germanium region meets the silicon substrate 102 at a Ge—Si interface region. This Ge—Si interface region is defined where outer sidewalls and a lower surface of the germanium region meet inner sidewalls and a recessed upper surface, respectively, of the silicon substrate.

Figure 12:
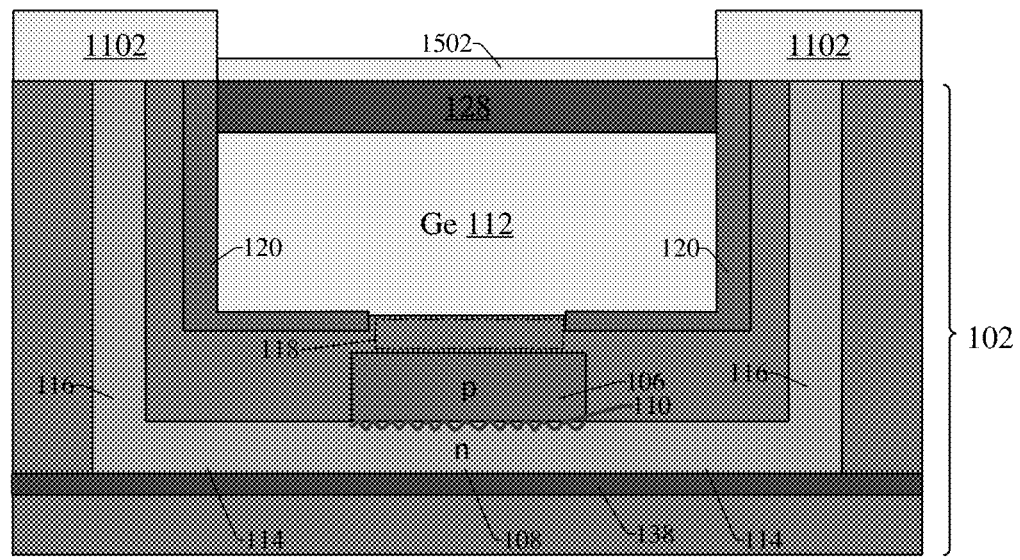

In FIG. 12, a cap 128 is formed over the germanium region 112. Formation of the cap 128 can be performed by an epitaxial grown process and can be done in situ (e.g., in the same tool as where the germanium region 112 is formed, and under a controlled atmosphere such as under vacuum or under nitrogen) to limit oxidation of the germanium region 112. In some cases, the cap 128 is epitaxially grown, p-type, monocrystalline silicon, and can have an upper surface that is raised above the upper surface of the substrate, though the upper surface of the cap can also be level with or even below the upper surface of the substrate. An oxide 1502 can then be formed over the cap 128, for example via a rapid thermal anneal or as a native oxide.

Figure 13:
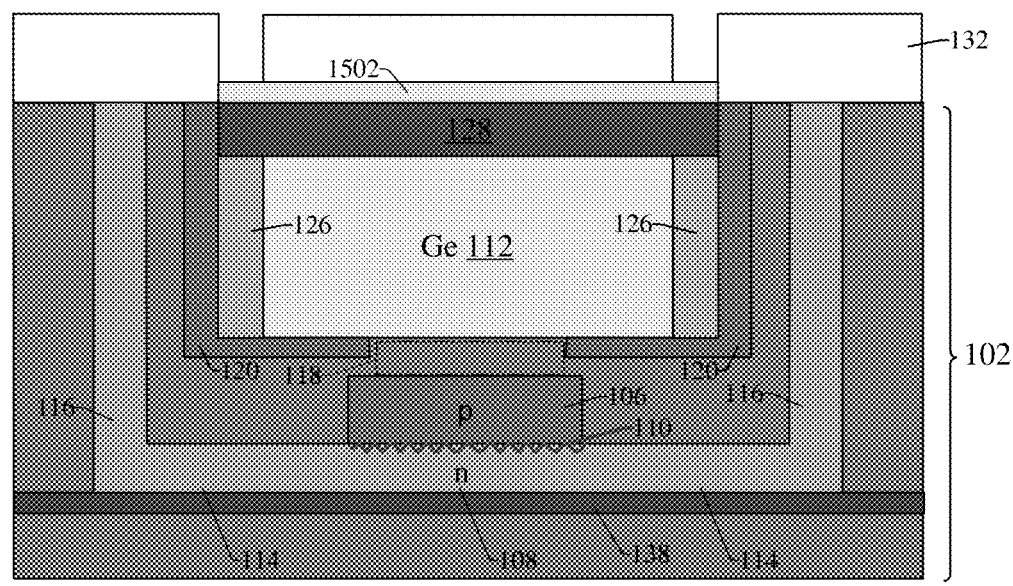

In FIG. 13, another ion implantation process is carried out to form p-type sidewall germanium regions 126. In some cases, another photomask is formed prior to this ion implantation, and then this ion implantation is carried out with the photomask in place to form the p-type sidewall germanium regions 126.

Figure 14:
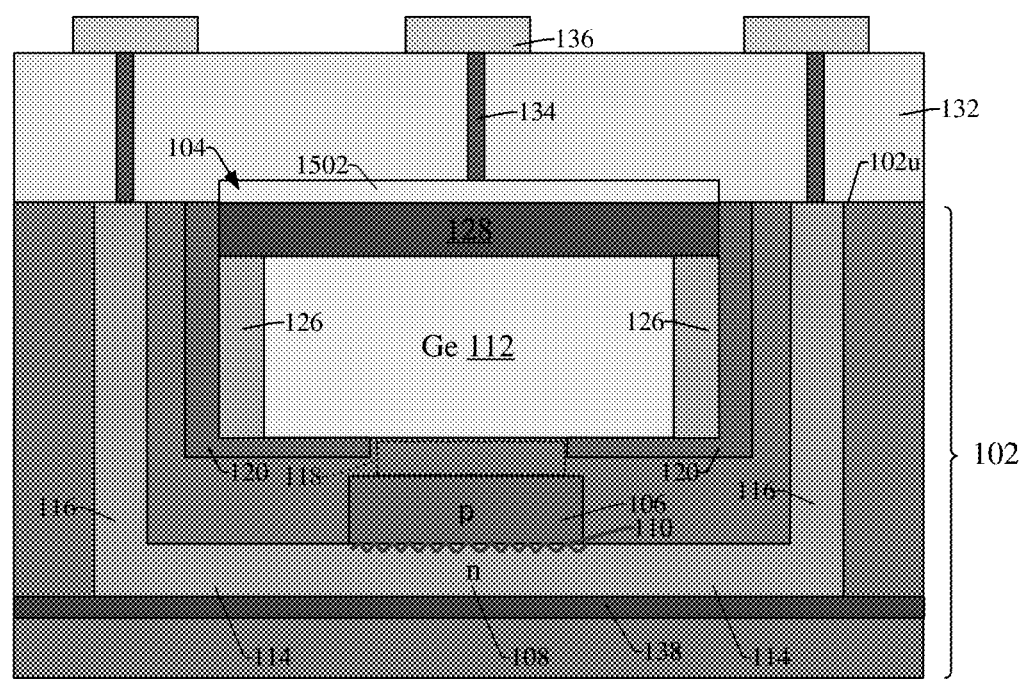

In FIG. 14, a dielectric structure 132 is formed on the upper surface of the silicon substrate 102. Contact openings are formed through the dielectric structure 132, and conductive contacts 134, such as metal contacts, and metal lines or conductive pads 136 are formed over the conductive contacts. The metal lines or conductive pads 136 can then be operably coupled to a bias circuit, which may include semiconductor devices formed on the silicon substrate 102 or formed on another semiconductor substrate. For example, if the semiconductor devices are formed on the semiconductor substrate, the semiconductor device may include transistors including fins and/or a gate electrode disposed on the upper surface of the substrate, or alternatively may include transistors including fins and/or a gate electrode disposed on the lower surface of the substrate in which case a through silicon via may extend through the substrate to facilitate the operable coupling.

FIGS. 15-21 show another manufacturing flow in accordance with other embodiments. In contrast to FIGS. 6-14, which showed formation of a single SPAD device, FIGS. 15-21 show first and second SPAD devices that are formed directly adjacent one another. Although FIGS. 15-21 are described in relation to a method, it will be appreciated that the structures disclosed in FIGS. 15-21 are not limited to such a method, but instead may stand alone as structures independent of the method.

Figure 15:
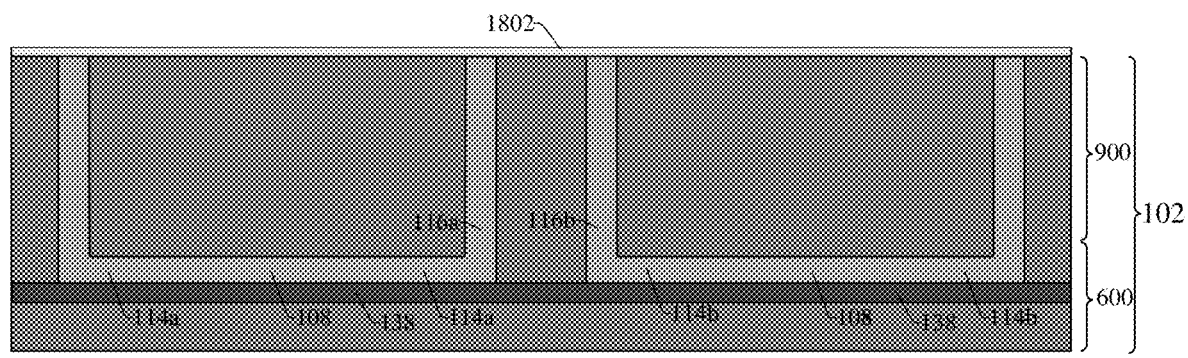

In FIG. 15, which corresponds in some regards to FIGS. 6-8, a base semiconductor substrate 600 is received, a blanket p-type implant is used to form a buried p-type region 138 in the semiconductor substrate. An n-type lateral connection region 114 is also formed, for example by forming a photomask and performing ion implantation. An epitaxial monocrystalline silicon region 900 is formed over an upper surface of the base semiconductor substrate 600, and an n-type vertical connection region 116 is formed. In this example, first and second n-type vertical connection regions 116a, 116b are spaced laterally apart by an isolation region of the semiconductor substrate.

Figure 16:
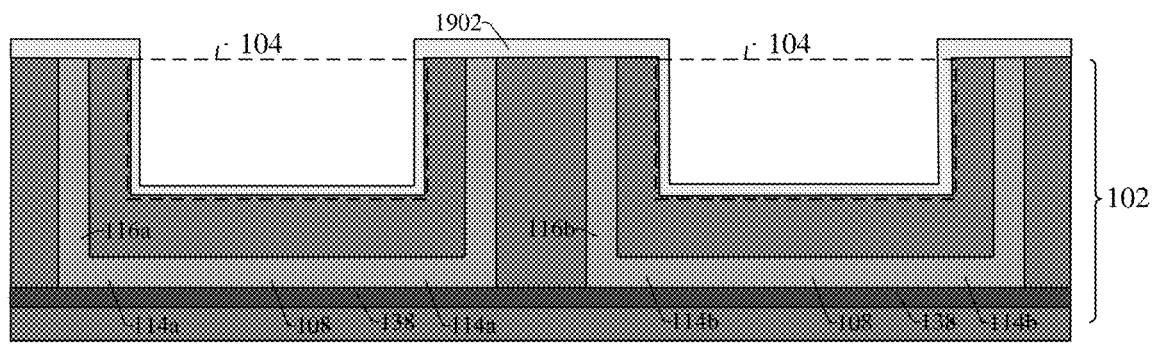

In FIG. 16, which corresponds in some regards to FIG. 9, an un-doped silicate glass (USG) region is formed, for example with a thickness ranging between 200 angstroms and 1200 angstroms. A third photoresist mask is then formed, and an etch is carried out with the third photomask in place to form recesses 104 in an upper surface of the semiconductor substrate. In some cases, the recesses may have a depth of approximately 1 micrometer. Another oxide layer can be formed, for example by in-situ steam generation (ISSG), to line a lower surface and sidewalls of the recess.

Figure 17:
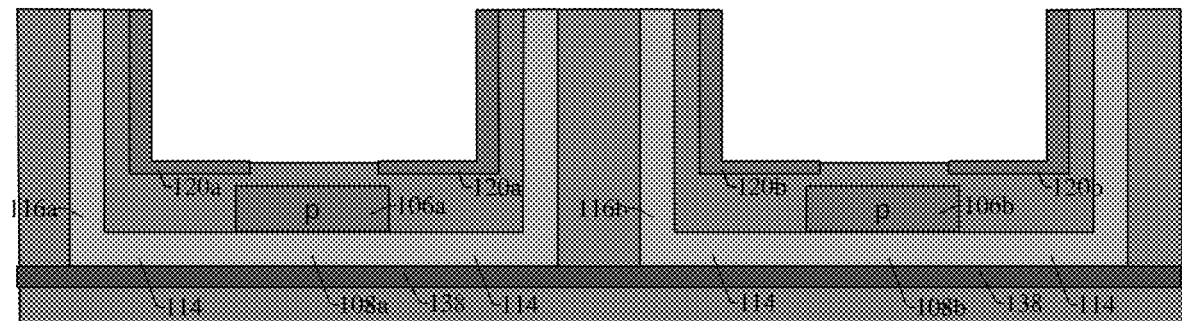

In FIG. 17, which corresponds in some regards to FIG. 11, p-type regions 106a, 106b, p-type sidewall portions 120a, and p-type base portions 120b are formed in the semiconductor substrate. The p-type regions 106a. 106b can formed at a depth d below the recessed surface, thereby leaving intrinsic silicon regions 118a. 118b between the p-type regions and the lower surface of the recess.

Figure 18:
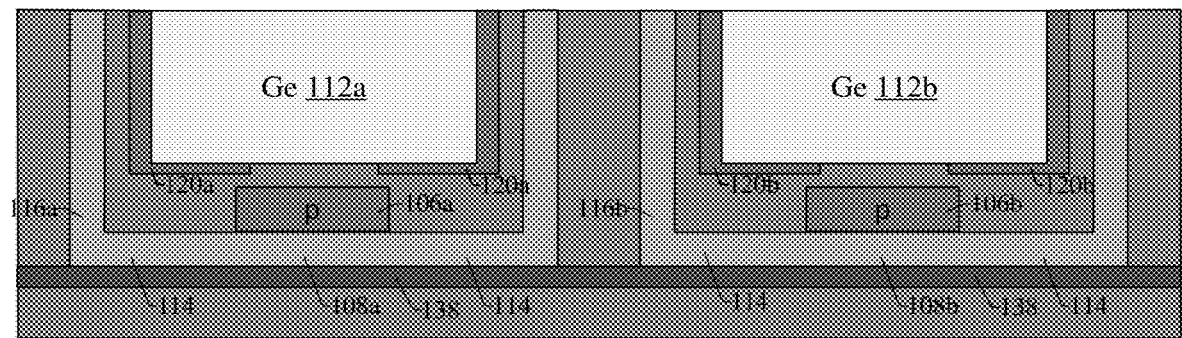

In FIG. 18, which also corresponds in some regards to FIG. 11, germanium regions 112a, 112b are formed, for example by epitaxial growth. The germanium regions can be formed to have an upper surface that recessed below an upper surface of the semiconductor substrate. However, in other embodiments, the germanium regions can be formed to have an upper surface that level with or even raised above an upper surface of the semiconductor substrate. In some cases, the germanium regions 112a, 112b form a thin alloy with the silicon substrate as the germanium region is grown, such that the germanium regions meets the silicon substrate 102 at Ge—Si interface regions. This Ge—Si interface region is defined where outer sidewalls and a lower surface of the germanium region meet inner sidewalls and a recessed upper surface, respectively, of the silicon substrate.

Figure 19:
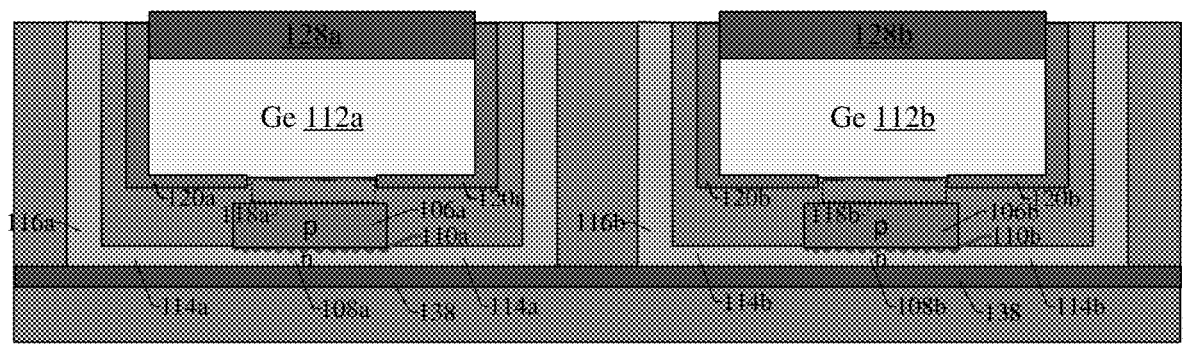

In FIG. 19, which corresponds in some regards to FIG. 12, silicon caps 128a, 128b are formed over the germanium regions 112a, 112b, respectively. Formation of the silicon caps can be performed by an epitaxial grown process and can be done in situ (e.g., in the same tool as where the germanium regions are formed, and under a controlled atmosphere such as under vacuum or under nitrogen) to limit oxidation of the germanium regions. In some cases, the epitaxially grown silicon caps are p-type. An oxide can then be formed over the silicon caps, for example via a rapid thermal anneal or as a native oxide.

Figure 20:
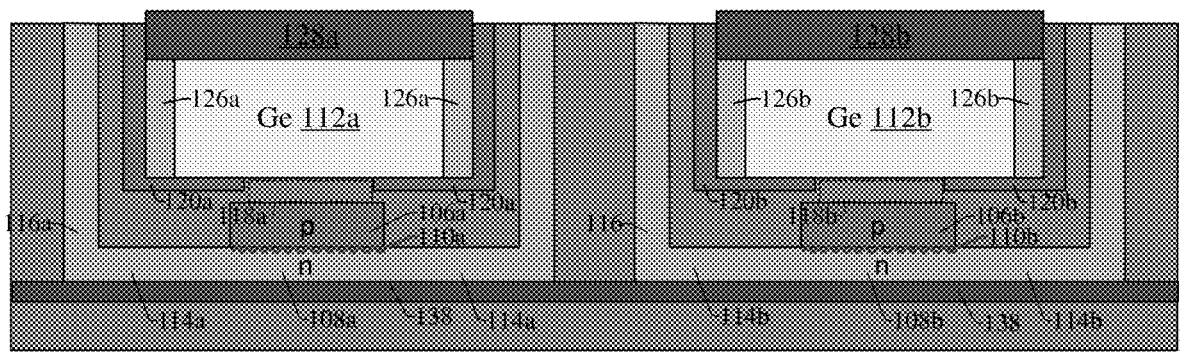

In FIG. 20, which corresponds in some regards to FIG. 13, another ion implantation process is carried out to form p-type germanium regions 126a, 126b. In some cases, another photomask is formed prior to this ion implantation, and then this ion implantation is carried out with the photomask in place.

Figure 21:
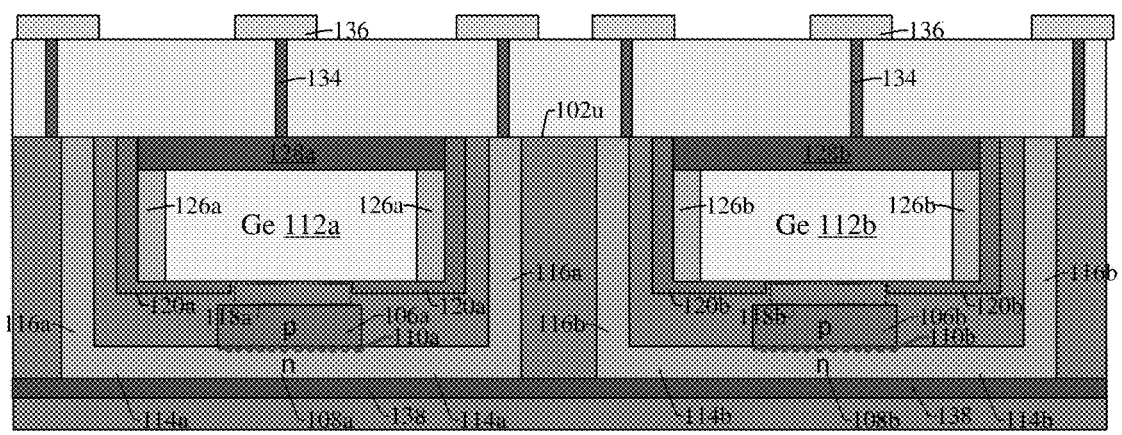
Figure 22:
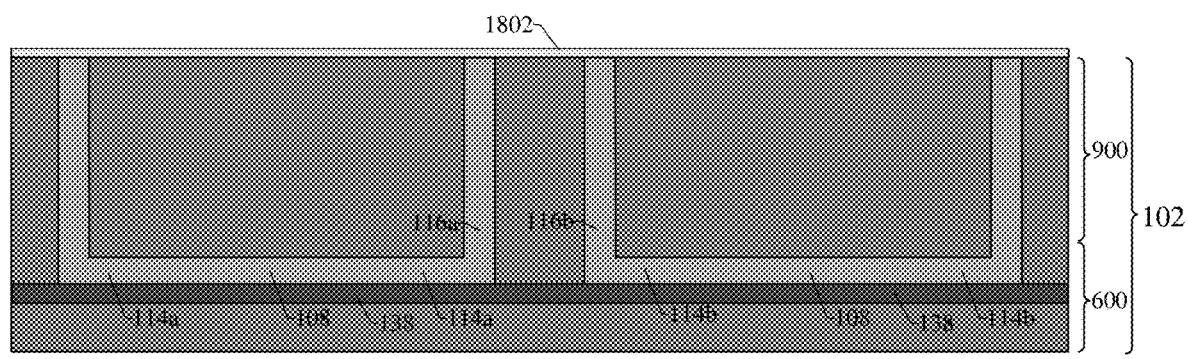
Figure 23:
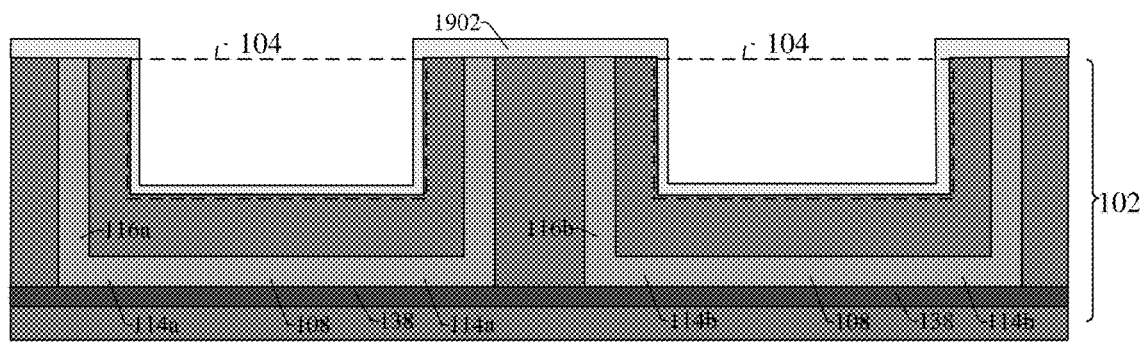
Figure 24:
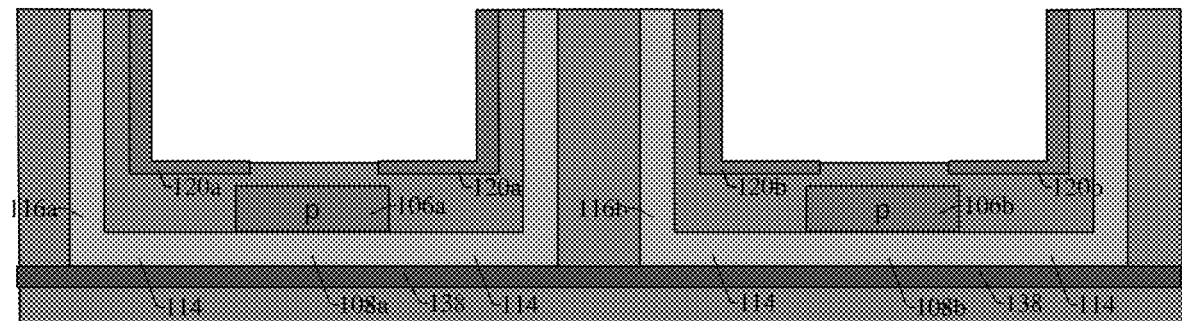
Figure 25:
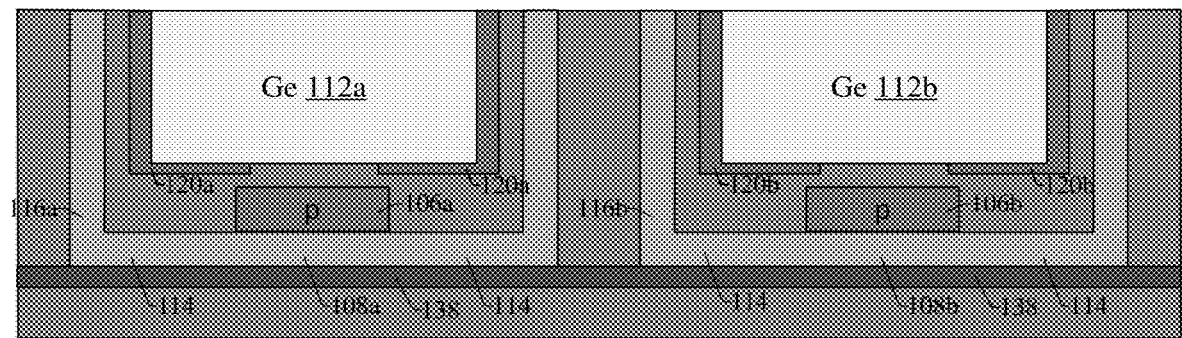
Figure 26:
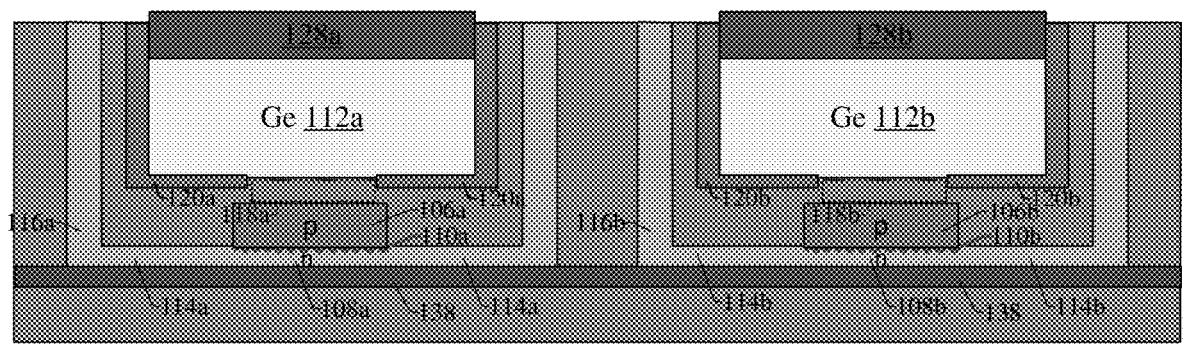
Figure 27:
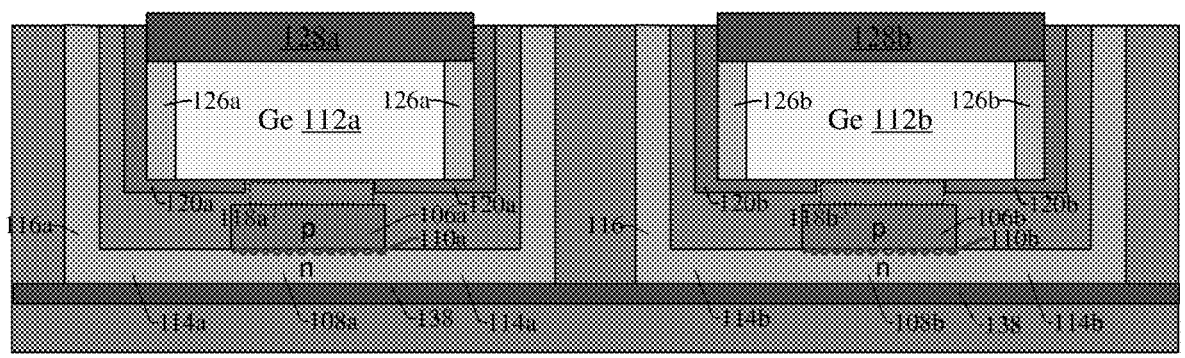
Figure 28:
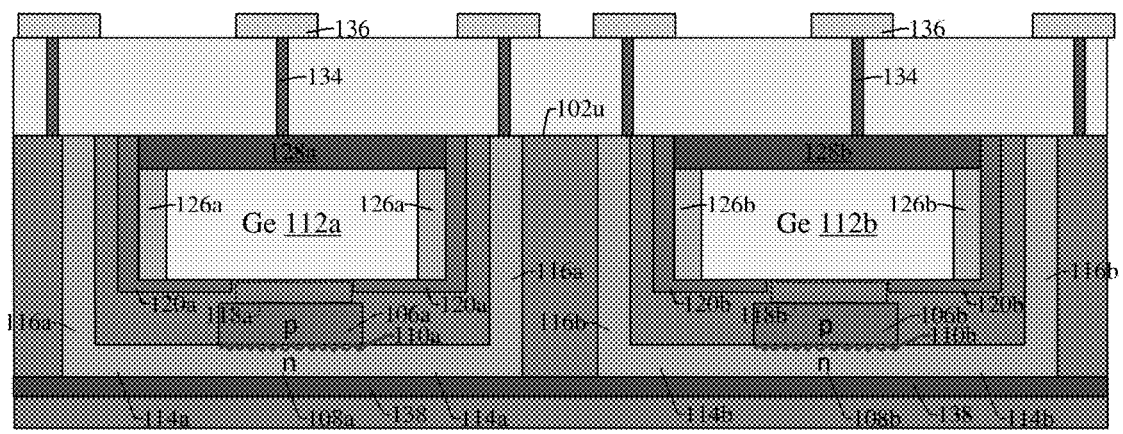
Figure 29:
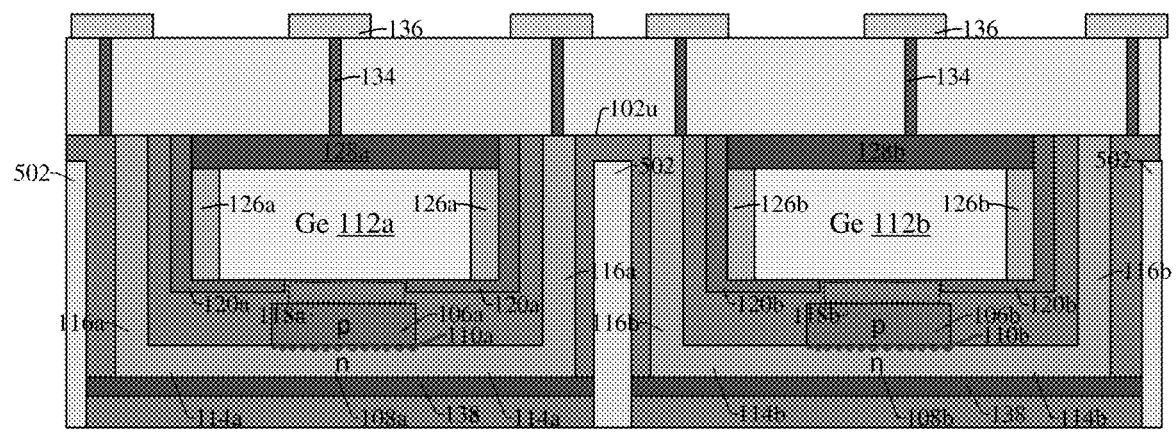

In FIG. 21, which corresponds in some regards to FIG. 14, a dielectric is formed on the upper surface of the substrate. Contact openings are formed through the dielectric, and conductive contacts 134, such as metal contacts, and contact pads or metal lines 136 are formed over the conductive contacts. The conductive pads or metal lines can then be operably coupled to a bias circuit and quench circuit, which may include semiconductor devices formed on the semiconductor substrate or formed on another semiconductor substrate. For example, if the semiconductor devices are formed on the semiconductor substrate, the semiconductor device may include transistors including fins and/or a gate electrode disposed on the upper surface of the substrate, or alternatively may include transistors including fins and/or a gate electrode disposed on the lower surface of the substrate in which case a through silicon via may extend through the substrate to facilitate the operable coupling. Thus, in FIG. 21, outer sidewalls of the n-type vertical connection regions 116a, 116b (e.g., guard rings) may be spaced apart from one another by an isolation region corresponding to a portion of the semiconductor substrate, and in the case of FIG. 21, monocrystalline silicon.

FIGS. 22-29 show another manufacturing flow in accordance with other embodiments. Although FIGS. 22-29 are described in relation to a method, it will be appreciated that the structures disclosed in FIGS. 22-29 are not limited to such a method, but instead may stand alone as structures independent of the method.

FIGS. 22-28 are generally consistent with previous FIGS. 15-21 and illustrate adjacent SPAD devices. However, in FIG. 29 (which follows from FIG. 28), an isolation structure 502 is formed from the lower surface of the semiconductor substrate to isolate the adjacent SPAD devices from one another. In some cases, this isolation structure 502 can be formed by forming a photomask on the lower surface of the semiconductor substrate and then carrying out an etch to form a trench in the lower surface of the semiconductor substrate, and then filling the trench with dielectric material. In other cases, the isolation structure 502 can be formed by implanting ions (e.g., p-type dopants) into the lower surface of the substrate.

FIG. 30 illustrates a flow chart of a manufacturing flow in accordance with some embodiments. While method 3300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

In act 3302, a semiconductor substrate is received.

In act 3304, ion implantation is performed to form a lateral connection region beneath an upper surface of the semiconductor substrate.

In act 3306, ion implantation is performed to form a vertical connection region. The vertical connection region and lateral connection region contact one another to establish a guard ring.

In act 3308, a recess is formed in the upper surface of the semiconductor substrate, the recess being laterally surrounded by the guard ring and being defined by a recessed upper surface of the semiconductor substrate and by inner sidewalls of the semiconductor substrate.

In act 3310, a germanium region is formed in the recess.

Thus, some embodiments relate to a single-photon avalanche detector (SPAD) device. The device includes a silicon substrate including a recess in an upper surface of the silicon substrate. A p-type region is arranged in the silicon substrate below a lower surface of the recess. An n-type avalanche region is arranged in the silicon substrate below the p-type region and meets the p-type region at a p-n junction. A germanium region is disposed within the recess over the p-n junction.

Other embodiments relate to a semiconductor structure. The semiconductor structure includes a semiconductor substrate, and a silicon based multiplication region buried in the semiconductor substrate. A germanium based absorption region is buried in the semiconductor substrate. The germanium based absorption region is located above the silicon based multiplication region. An electron channel is arranged between the silicon based multiplication region and the germanium based absorption region.

Still other embodiments relate to a method. In the method, a semiconductor substrate is received. Ion implantation is performed to form a lateral connection region beneath an upper surface of the semiconductor substrate. Ion implantation is performed to form a vertical connection region. The vertical connection region and lateral connection region contact one another to establish a guard ring. A recess is formed in the upper surface of the semiconductor substrate, and the recess is laterally surrounded by the guard ring and is defined by a recessed upper surface of the semiconductor substrate and by inner sidewalls of the semiconductor substrate. A germanium region is formed in the recess.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A single-photon avalanche detector (SPAD) device comprising:
   a silicon substrate including a recess in an upper surface of the silicon substrate;
   a p-type region arranged in the silicon substrate below a lower surface of the recess;
   an n-type avalanche region arranged in the silicon substrate below the p-type region and meeting the p-type region at a p-n junction; and
   a germanium region disposed within the recess over the p-n junction.

2. The SPAD device of claim 1, wherein the germanium region meets the silicon substrate at a Ge—Si interface region comprised of a Ge—Si alloy having a lattice constant ranging between 56.6 nanometers and 54.3 nanometers, and wherein the Ge—Si interface region is defined where outer sidewalls and a lower surface of the germanium region meet inner sidewalls and a recessed upper surface, respectively, of the silicon substrate.

3. The SPAD device of claim 1, further comprising:
an n-type lateral connection region extending laterally from outer edges of the n-type avalanche region past outer sidewalls of the germanium region; and
an n-type vertical connection region extending upwardly from outer edges of the n-type lateral connection region to an upper surface of the silicon substrate.

4. The SPAD device of claim 3, wherein the n-type avalanche region, the n-type lateral connection region, and the n-type vertical connection region collectively establish a substantially U-shaped profile that generally enclose the p-type region and the germanium region.

5. The SPAD device of claim 1, further comprising:
an intrinsic silicon region disposed between an upper extent of the p-type region and a lower surface of the germanium region, the intrinsic silicon region configured to act as an electron channel that extends an entire distance between the p-n junction and the germanium region.

6. The SPAD device of claim 5, further comprising:
a p-type surface region arranged in the silicon substrate and laterally surrounding the intrinsic silicon region and extending upwards along inner sidewalls of the recess in the silicon substrate and along outer sidewalls of the germanium region.

7. The SPAD device of claim 1, wherein the germanium region comprises:
an upper germanium region having a first p-type doping concentration, and
a lower germanium region having a second p-type doping concentration, the second p-type doping concentration being less than the first p-type doping concentration.

8. The SPAD device of claim 7, further comprising:
a sidewall germanium region that extends continuously along an outer sidewall of the germanium region and traverses the upper germanium region and the lower germanium region.

9. The SPAD device of claim 1, further comprising:
a silicon cap disposed in the recess over an upper surface of the germanium region.

10. The SPAD of claim 9, wherein the upper surface of the silicon cap is level with an uppermost surface of the silicon substrate.

11. The SPAD device of claim 9, further comprising:
a sidewall germanium region that is arranged in an outer edge of the recess and that has an upper surface that meets a bottom surface of the silicon cap.

12. The SPAD device of claim 1, wherein the germanium region comprises:
an epitaxial bulk germanium region buried in the silicon substrate; and
a p-type germanium region extending along outer edges of the epitaxial bulk germanium region and separating the epitaxial bulk germanium region from the silicon substrate.

13. A semiconductor structure, comprising:
a semiconductor substrate;
a silicon based multiplication region provided in the semiconductor substrate;
a germanium based absorption region provided in the semiconductor substrate, the germanium based absorption region being located above the silicon based multiplication region; and
an electron channel region between the silicon based multiplication region and the germanium based absorption region;
wherein the silicon based multiplication region comprises:
a p-type region in the semiconductor substrate; and
an n-type region in the semiconductor substrate, wherein a p-n junction interface is defined where the p-type region meets the n-type region.

14. A semiconductor structure, comprising:
a semiconductor substrate;
a silicon based multiplication region provided in the semiconductor substrate;
a germanium based absorption region provided in the semiconductor substrate, the germanium based absorption region being located above the silicon based multiplication region; and
an electron channel region between the silicon based multiplication region and the germanium based absorption region;
wherein the germanium based absorption region comprises:
an epitaxial bulk germanium region buried in the semiconductor substrate; and
a p-type germanium region extending along outer edges of the epitaxial bulk germanium region and separating epitaxial bulk germanium region from the semiconductor substrate.

15. A semiconductor structure, comprising:
a semiconductor substrate;
a lateral connection region beneath an upper surface of the semiconductor substrate, the lateral connection region having a first doping type;
a vertical connection region disposed in the semiconductor substrate and having the first doping type, the vertical connection region contacting the lateral connection region to establish a guard ring;
an absorption structure having a second doping type that contacts an upper surface of the lateral connection region such that the absorption structure and the lateral connection region form a p-n junction, the absorption structure being laterally surrounded by the vertical connection region; and
a germanium region disposed over the absorption structure and having the second doping type, the germanium region being laterally surrounded by the vertical connection region.

16. The semiconductor structure of claim 15, further comprising:
an intrinsic silicon region sandwiched between a lower surface of the germanium region and an upper surface of the absorption structure.

17. The semiconductor structure of claim 16, wherein the intrinsic silicon region has outer sidewalls that contact inner sidewalls of the lateral connection region directly below the germanium region.

18. The semiconductor structure of claim 17, wherein the germanium region has outer sidewalls that extend laterally past outer edges of the p-n junction.

19. The semiconductor structure of claim 15, further comprising:
a silicon cap over an upper surface of the germanium region, wherein the silicon cap directly contacts an upper surface of the germanium region without an oxide separating the germanium region from the silicon cap.

20. The semiconductor structure of claim 19, wherein the germanium region comprises:
   a sidewall germanium region that is arranged along an inner sidewall of the vertical connection region and that has an upper surface that meets a bottom surface of the silicon cap.

\* \* \* \* \*